United States Patent

Takahisa et al.

[11] Patent Number: 5,946,605
[45] Date of Patent: Aug. 31, 1999

[54] METHOD AND APPARATUS FOR COMMUNICATING INFORMATION USING A DATA TUNER

[75] Inventors: Tsutomu Takahisa, Santa Clara, Calif.; Koyo Hasegawa, Tokyo, Japan; Satoru Takashima, Santa Clara, Calif.

[73] Assignee: Digital DJ, Santa Clara, Calif.

[21] Appl. No.: 08/653,508

[22] Filed: May 24, 1996

[51] Int. Cl.$^6$ ........................................... H04B 7/00
[52] U.S. Cl. .................. 455/66; 455/150.1; 455/161.1; 455/161.2; 455/184.1; 455/186.1
[58] Field of Search .......................... 455/45, 66, 150.1, 455/151.1, 151.2, 151.3, 151.4, 160.1, 161.1, 161.2, 152.1, 185.1, 186.1, 186.2, 345, 184.1

[56] References Cited

U.S. PATENT DOCUMENTS

| | | | |
|---|---|---|---|
| 4,644,347 | 2/1987 | Lucas et al. | 340/825.04 |
| 4,723,302 | 2/1988 | Fulmer et al. | 455/161.2 |
| 5,023,938 | 6/1991 | Takegawa et al. | 455/184.1 |
| 5,379,454 | 1/1995 | Takegawa et al. | 455/186.2 |
| 5,457,816 | 10/1995 | Koyama | 455/161.2 |
| 5,483,684 | 1/1996 | Ono et al. | 455/161.2 |
| 5,491,469 | 2/1996 | Schwendeman | 340/825.04 |
| 5,628,061 | 5/1997 | Shirakawa | 455/161.1 |

FOREIGN PATENT DOCUMENTS

| | | | |
|---|---|---|---|
| 0687082A1 | 6/1995 | European Pat. Off. | H04H 1/00 |
| 4125433C1 | 8/1991 | Germany | H04H 1/00 |

*Primary Examiner*—William A. Cuchlinski, Jr.
*Assistant Examiner*—Gertrude Arthur
*Attorney, Agent, or Firm*—Fenwick & West LLP

[57] ABSTRACT

A method and apparatus allows a data tuner to communicate information. An identifier of the frequency used to transmit the data may be transmitted by a control center to a receiver coupled to the data tuner to notify a user to tune to that frequency to receive the data. The data tuner may transmit a frequency identifier to the control center to instruct the control center which frequency to use to broadcast the data. This frequency may be the frequency to which a user is already tuned, or a frequency meeting certain criteria, such as one having reception exceeding a threshold amount. The data tuner may scan header information provided by several frequencies to identify a frequency meeting certain criteria. The data tuner may provide information to a control center using a transmitter coupled to the data tuner in response to requests for information received by the data tuner.

1 Claim, 14 Drawing Sheets

METHOD AND APPARATUS FOR COMMUNICATING INFORMATION USING A DATA TUNER

RELATED APPLICATIONS

This is a continuation in part of U.S. patent application Ser. No. 08/643,801, entitled "Broadcast Data System with Multiple-Tuner Receiver" filed May 6, 1996, which is continuation in part of U.S. patent application Ser. No. 08/549,655, filed Oct. 27, 1995, which is a continuation in part of U.S. patent application Ser. No. 08/425,993, filed Apr. 20, 1995, which is a continuation in part of U.S. patent application Ser. No. 08,045,352, filed Apr. 8, 1993, now U.S. Pat. No. 5,491,838.

FIELD OF INVENTION

The present invention relates to broadcast receivers, and more specifically to data receivers.

BACKGROUND OF THE INVENTION

Data tuners receive information and applications which are broadcast to them in digital form. Referring now to FIG. 1 a conventional data tuner is shown. A broadcast signal is received by antenna 146 coupled to data and source program tuner 144. Data and source program tuner 144 receives data formatted for a data tuner and a conventional source program on the same frequency. Selector 152 is used by a user to change the tuned frequency of data and source program tuner 144. One output 149 of data and source program tuner 144 may be used to reproduce the source program in a conventional receiver fashion, for example to reproduce an audio signal when output 149 is coupled to amplifier 148 which is in turn coupled to speaker 150 in a conventional fashion. Data tuner 144 has output 147 coupled to a decoder 142, which decodes the data signal received by the data tuner 144. Processor 140 is coupled to decoder 142 and may be a microprocessor or a set of interconnected combinational logic to perform the functions described herein.

Processor 140 runs the applications received by data tuner 144 or interprets commands received by data tuner 144 in accordance with a stored program (not shown) and interprets user commands. These applications may instruct processor 140 to display certain data on display 128 using display driver 130. Information may be displayed in the center portion of display 128, or in specific areas of the display 128, such as areas 120, 122, 124, 126. Information displayed in areas 120, 122, 124, 126 may correspond to actions which may be performed when a user depresses one of the corresponding indicators, switches or buttons 110, 112, 114, 116.

Control Center 190 directs the broadcast of data by broadcasting stations 192, 194 which may also broadcast source programs.

In one arrangement, a broadcaster may only broadcast certain types of information over a particular frequency, requiring the data and source program tuner 144 to be tuned to that frequency in order to receive that information. If the data and source program tuner 144 is not tuned to the frequency carrying the information, the information will not be displayed on the display 128, and the user will not receive the information.

Systems using data tuners sometimes experience difficulties in the collection of information to be broadcast. Data tuners may be used to display information such as environmental conditions, like traffic and weather information, with the information collected using helicopters and weather monitoring stations. Many broadcasting stations are limited to a few of these collection devices because of the expense of the devices. In addition, weather monitoring stations monitor only the weather in the location at which they are installed, with potential weather differences occurring only a few miles away occurring undetected. Helicopters may be directed to different locations depending on interest, but at a high cost of a trained operator and equipment. Although helicopters may move from location to location rapidly, they cannot be at two locations at the same time, nor can they move large distances instantaneously. Point to point transceivers such as cellular telephones may be outfitted with sensors to provide the required information, but the data received from them is difficult to manage if many are in use at the same time, resulting in limiting the use of the transceivers to only a few, limited coverage, a lack of control of the data transmissions from such transceivers resulting in data overload, or combinations of the above.

SUMMARY OF INVENTION

In accordance with the present invention, a system for receiving desired information broadcast by a broadcast station includes a frequency selectable data tuner for receiving information broadcast on a frequency, a receiver for receiving over a second frequency a status message identifying the frequency on which the desired information is broadcast, and a processor for receiving the frequency identifier and for sending the frequency identifier received at the processor input.

Also in accordance with the present invention, a method of receiving desired information broadcast over a first frequency includes receiving over a second frequency a frequency identifier corresponding to the first frequency, tuning a data tuner to the first frequency and, receiving the desired information on the data tuner tuned.

Also in accordance with the present invention, a method of broadcasting desired information over a first frequency to a data tuner includes transmitting over a second frequency a frequency identifier corresponding to the first frequency, and broadcasting over the first frequency the desired information.

Also in accordance with the present invention, a system for receiving desired information on a data tuner over a first frequency includes a transmitter for transmitting a signal on a second frequency, a frequency selector for selecting the tuned frequency of the data tuner, and a processor for sending tuned frequency of the data tuner to the transmitter.

Also in accordance with the present invention, a method of receiving data of interest on a data tuner includes identifying a first frequency for the receipt of the data of interest, transmitting on a second frequency an identifier corresponding to the first frequency identified, and receiving the data of interest from a broadcast on the first frequency corresponding to the identifier transmitted.

Also in accordance with the present invention, a method of broadcasting data of interest includes receiving an identifier of a first frequency over a second frequency, and broadcasting the data of interest over the first frequency corresponding to the identifier received.

Also in accordance with the present invention, a system for identifying from a plurality of broadcast frequencies having a header, a broadcast frequency having data of interest capable of being received by a frequency selectable data tuner includes a processor including a frequency scanner having an output coupled to the processor output, the scanner for scanning frequencies to allow the processor to read the header of several broadcast frequencies and select at least one broadcast frequency according to the criteria received and the header of the broadcast frequency selected.

Also in accordance with the present invention, a method of identifying from a plurality of broadcast frequencies having an identifier, at least two of the broadcast frequencies comprising a header, at least one of the identifiers of the broadcast frequencies corresponding to at least one criterion includes reading at least one of the criterion, sequentially scanning a plurality of the broadcast frequencies, for each of a plurality of the broadcast frequencies scanned, reading the header of the broadcast frequency, comparing the header to at least one criterion read and storing an identifier corresponding to the broadcast frequency responsive to the header and the criterion compared, and identifying at least one of the identifiers stored.

Also in accordance with the present invention, a system for transmitting environmental conditions to a control center over a first frequency includes a data tuner for receiving requests for information from the control center over a second frequency, a plurality of sensors for sensing environmental conditions, a processor coupled to the sensor outputs for receiving the data from the sensors for sending at least a portion of data corresponding to the data from the sensors in response to the request, and a transmitter for transmitting the data from the processor over the first frequency.

Also in accordance with the present invention, a method of transmitting environmental data includes collecting environmental data, receiving a request over a first frequency to send at least a portion of data corresponding to the data collected, and sending at least the portion of the data corresponding to the request received over a second frequency.

Also in accordance with the present invention, a method of communicating environmental data collected from a plurality of sources includes broadcasting a request for environmental data to a plurality of the sources over a first frequency, and receiving at least a portion of the environmental data requested over a second frequency.

The features and advantages described in the specification are not all-inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION OF A PREFERRED EMBODIMENT

Figure 2:
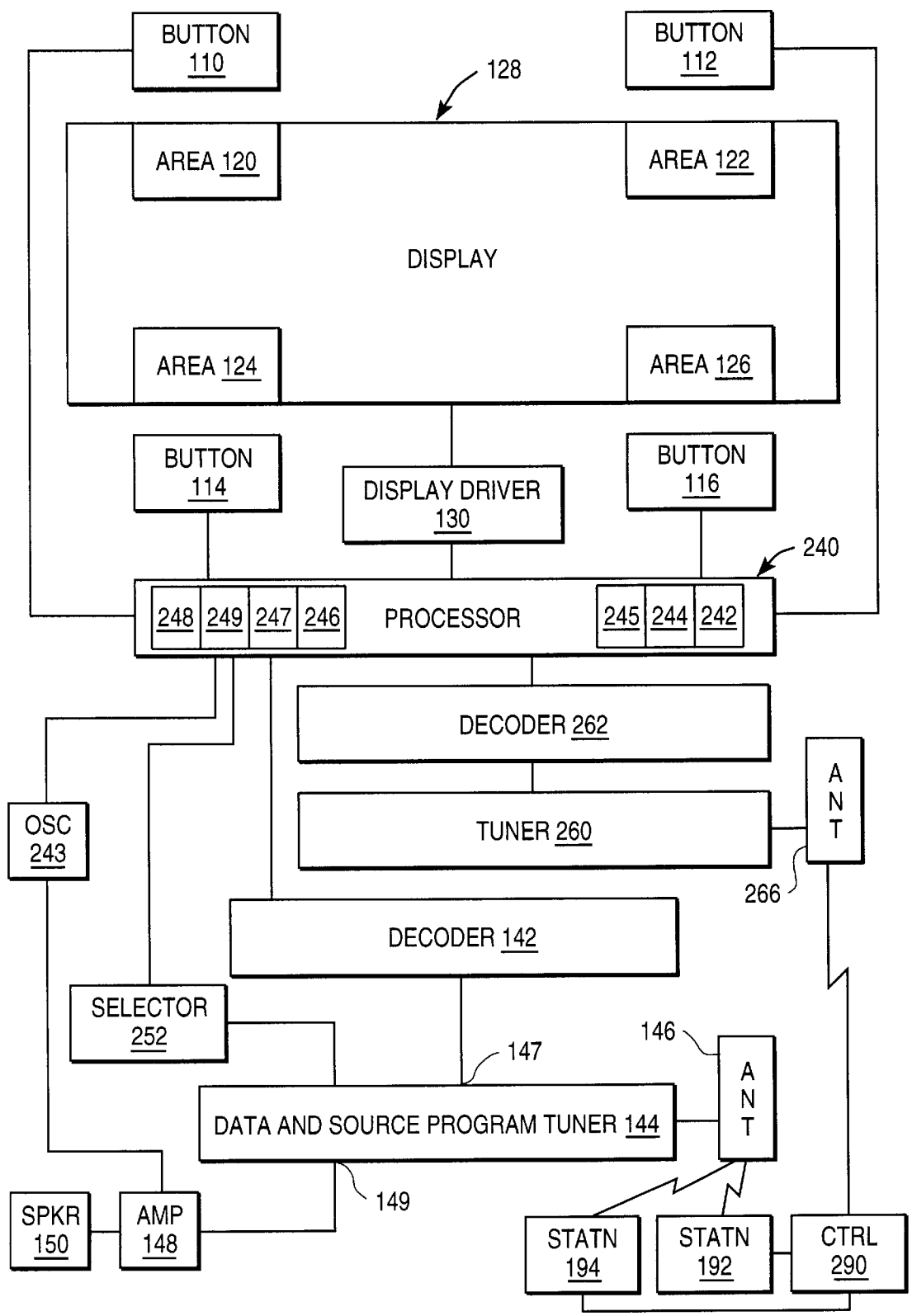
FIG. 2 is a block schematic diagram of a system including a data tuner and an additional tuner according to one embodiment of the present invention.

Referring now to FIG. 2, a data tuner coupled to an additional tuner for receiving a frequency containing information of interest according to one embodiment of the present invention is shown. Data and source program information may be received and decoded using antenna 146, tuner 144 and decoder 142 and reproduced using amplifier 148 and speaker 150. Although a data tuner is coupled herein with a source program tuner to provide a data and source program tuner 144, it is understood that the present invention operates with a data tuner by itself. Processor 240 is coupled to decoder 142 to allow data and applications received by antenna 146 to be displayed on display 128 via display driver 130, and controlled by a user using buttons 110, 112, 114, 116. The system illustrated in FIG. 2 also contains an additional tuner 260, which may be any form of broadcast receiver tuned to a known frequency or frequencies such as a conventional one- or two- way pager tuner or cellular telephone tuner, to receive signals which describe the frequency of a broadcaster which is broadcasting or will broadcast information of interest to the user of the apparatus of FIG. 2.

Figure 1:
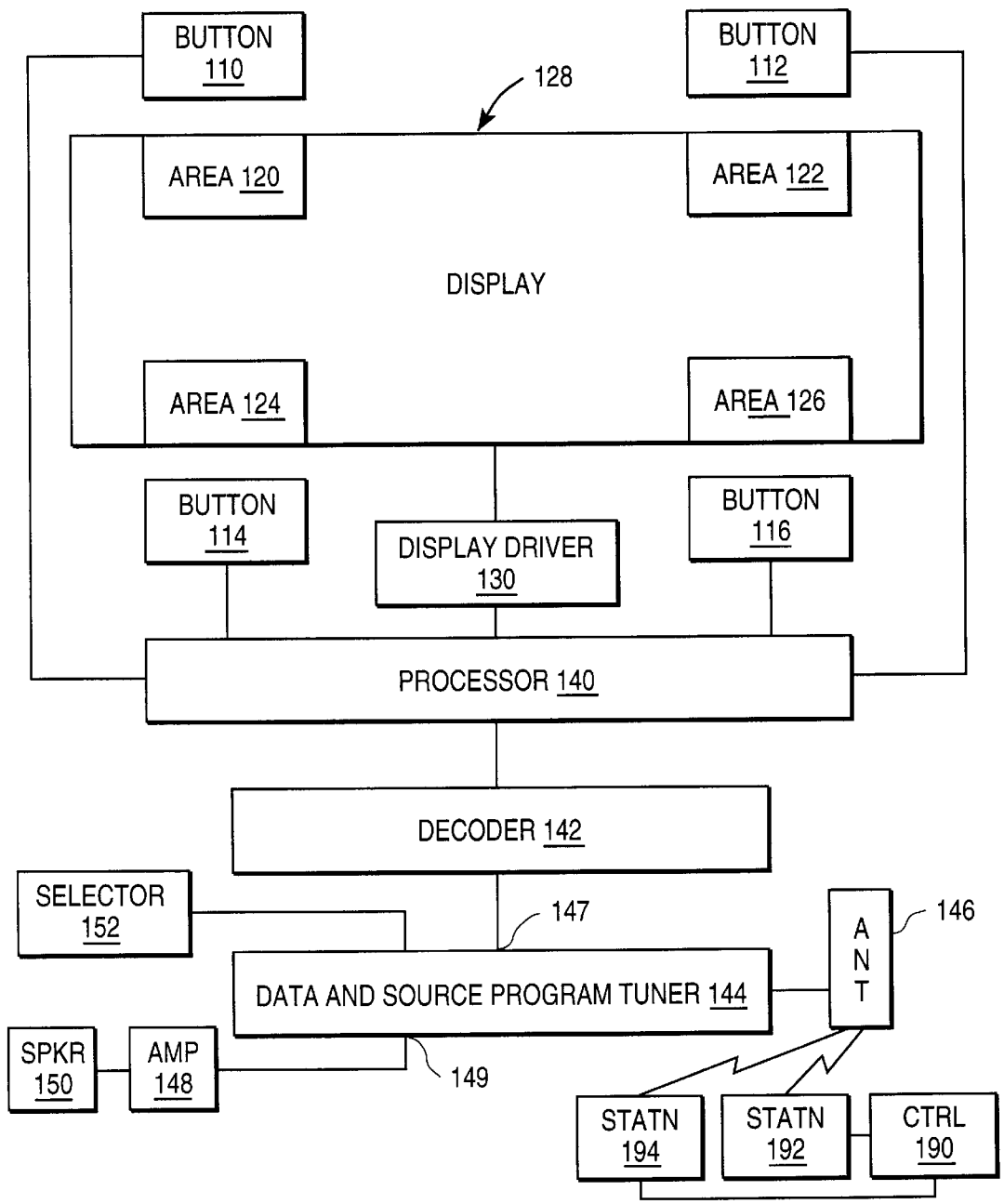
FIG. 1 is a block schematic diagram of a conventional data tuner system.

The signal received is decoded by decoder 262 which is coupled to the additional tuner 260. Decoder 262 is coupled to processor 240, which may be a programmed computer or combinational logic configured to perform the functions of processor 140 of FIG. 1, as well as the additional functions described herein. In one embodiment, processor 240 determines if the signal received from tuner 260 corresponds to the user of the apparatus. In one embodiment, each processor 240 contains an identification code stored in a storage device 242 such as a memory or a switch so as to allow the processor 240 to identify its user. The broadcaster of the signal received by antenna 266 not only broadcasts a descriptor of the frequency or frequencies which may broadcast information of interest, but also one or more codes corresponding to the code stored in storage device 242 to identify the processors 240 for which the signal is intended. In one embodiment, each code in storage device 242 is unique, and the broadcaster sends the code stored in storage device 242 for each processor 240 for which the signal is intended. In another embodiment, the code or codes stored in storage device 242 corresponds to one or more of the user's areas of interest, and the broadcaster sends a code corresponding to the area of interest related to the information the broadcaster will broadcast. Code match 244 compares the code received by decoder 262 to the code stored in storage device 242, and if an intended match is discovered, the frequency received from tuner 260 is stored in frequency store 246 which is a storage device such as a memory. The frequency received is further processed as described below.

If such a match is discovered, optional frequency compare 248 may be used to identify whether the user is already tuned to the proper frequency, in which case no further tuning is required. Frequency compare 248 in processor 240 compares the frequency received by decoder 262, and optionally stored in frequency store 246, with the frequency of the data and source program tuner 144 which the user has presently selected using frequency selector 252, one output of which is coupled to processor 240.

If the frequency compare 248 determines that the user would need to change frequencies in order to tune the data and source program tuner 144 to receive the information of interest, or if no frequency compare is made, in one embodiment the user is prompted whether he wishes to tune the data tuner to the different frequency having the information of interest. For example, processor 240 may instruct display driver 130 to display a message, "Traffic accident on highway 101—Tune to KPIX 95.7 for additional information?" on display 128. This message may be received as a part of the signal by antenna 266 and tuner 260, decoded by decoder 262 and stored in storage device 245 for display as described above. Alternatively, some or all of it may be prestored in storage device 245, with the signal designating which prestored message to use and providing the missing information, such as the station identifier KPIX, the frequency 95.7 and highway number 101, and processor 240 may then construct the complete message for sending to display driver 130. In one embodiment, area 124 of display 128 displays "YES" and area 126 of display 128 displays "NO" upon direction of the processor 240 via display driver 130. In one embodiment, processor 240 is coupled to oscillator 243 which is coupled to amplifier 148 to allow the processor to send an indicator such as a beep to speaker 150 around the time the above message has been so displayed so as to alert a user who may be listening to the source program received by the source program tuner 144 and reproduced by amplifier 148 and loudspeaker 150 but not looking at the display 128 that a message such as is described above has appeared or is about to appear on the display.

In one embodiment, if the user presses button 116 corresponding to a "NO" response, no tuning adjustments are made and the system ceases to display the message described above. In one embodiment, processor 240 contains a timer 247 which is initiated upon the display of the message and which signals the processor 240 that a preset time period has elapsed. If the user has not responded during this preset time period, processor 240 interprets the lack of response in the same manner as a "NO" response, and clears the message from the display. If the user signals "YES" by pressing button 114, processor 240 sends the frequency received by decoder 262, and optionally stored in frequency store 246 to selector 252, which changes the tuned frequency of data and source program tuner 144 to the frequency stored in frequency store 246 and overriding the user's previous selected tuned frequency, allowing the information of interest to be received by data and source program tuner 144.

In another embodiment, a message may be initiated by processor 240 via driver 130 on display 128 asking the user if all such signals received by tuner 260 indicating information of interest should automatically switch the data and source program tuner, with "YES" and "NO" displayed as described above. If the user indicates "YES" using the corresponding button 114 or 116, the processor stores the response in storage device 249 such as a memory and the receipt of a signal by tuner 260 and decoder 262 causes processor 240 to send the frequency identifier indicated in the signal to selector 252 to change the tuned frequency of the data and source program tuner 144 without prompting the user as described above.

In another embodiment, the user is prompted to change frequencies as described above where information of interest is available, but another frequency is more suitable because it has unused data capacity.

Figure 3:
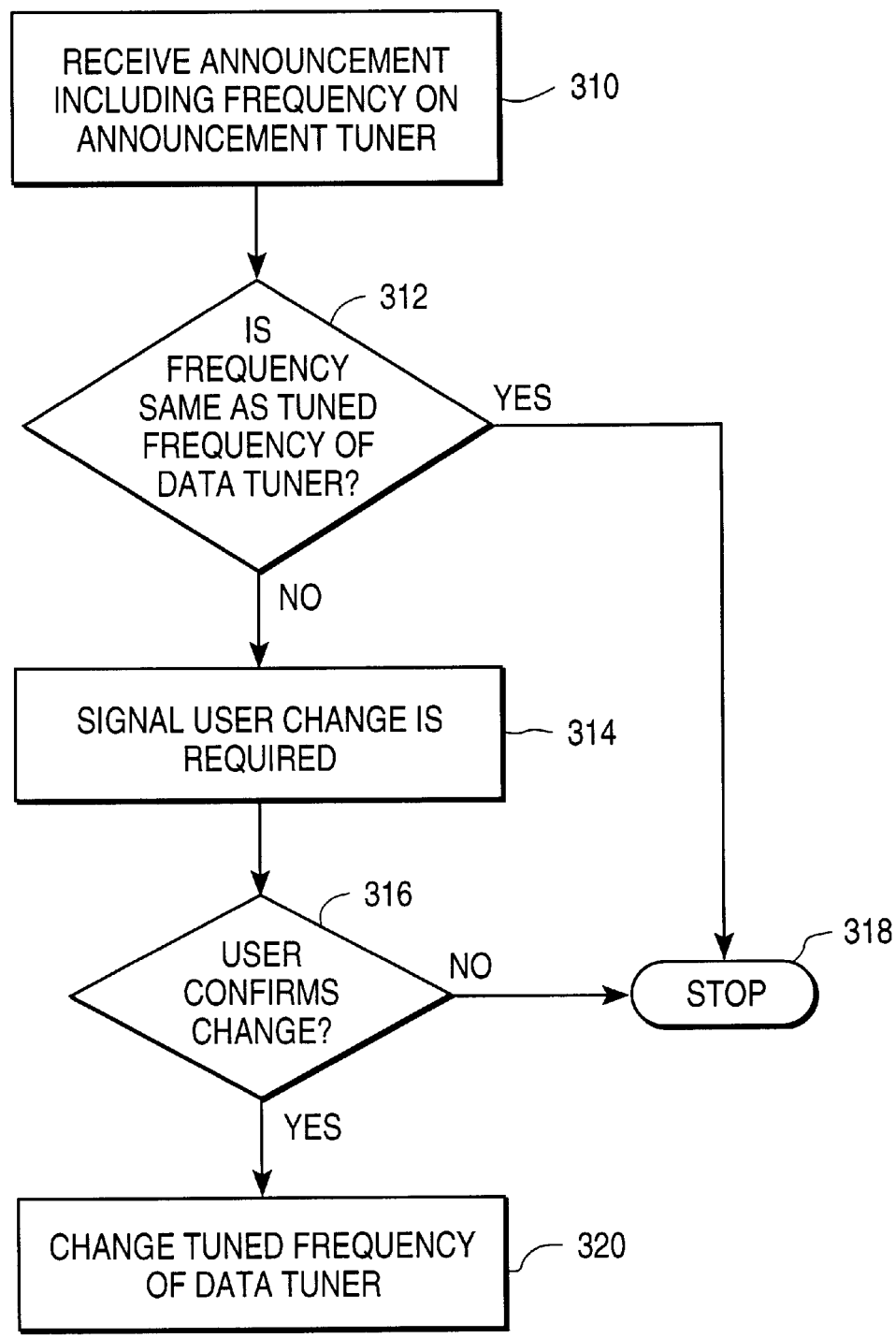
FIG. 3 is a flowchart illustrating a method of tuning a data tuner according to one embodiment of the present invention.

Referring now to FIG. 3, a method of tuning a data tuner according to one embodiment of the present invention is shown. An announcement containing a frequency identifier is received on an announcement tuner 310 and optionally checked against the tuned frequency of a data tuner 312. The announcement may contain a message to be displayed or may contain an identifier of a known message and other data to be inserted into the message. If the frequency identifier received corresponds to the same frequency as the tuned frequency of the data tuner, the method terminates 318. If the frequency corresponding to the identifier received is not the same as the tuned frequency of the data tuner, the user may be optionally signaled that a change is required 314. If the user does not confirm the change, the method terminates 318, otherwise the tuned frequency of the data tuner is changed to the frequency indicated by the frequency of the announcement 320.

It is noted that a frequency may be identified in many ways, any of which may be used as a frequency identifier. Identifiers such as call letters, megahertz numbers, or other indicators may be used according to the present invention.

Figure 4:
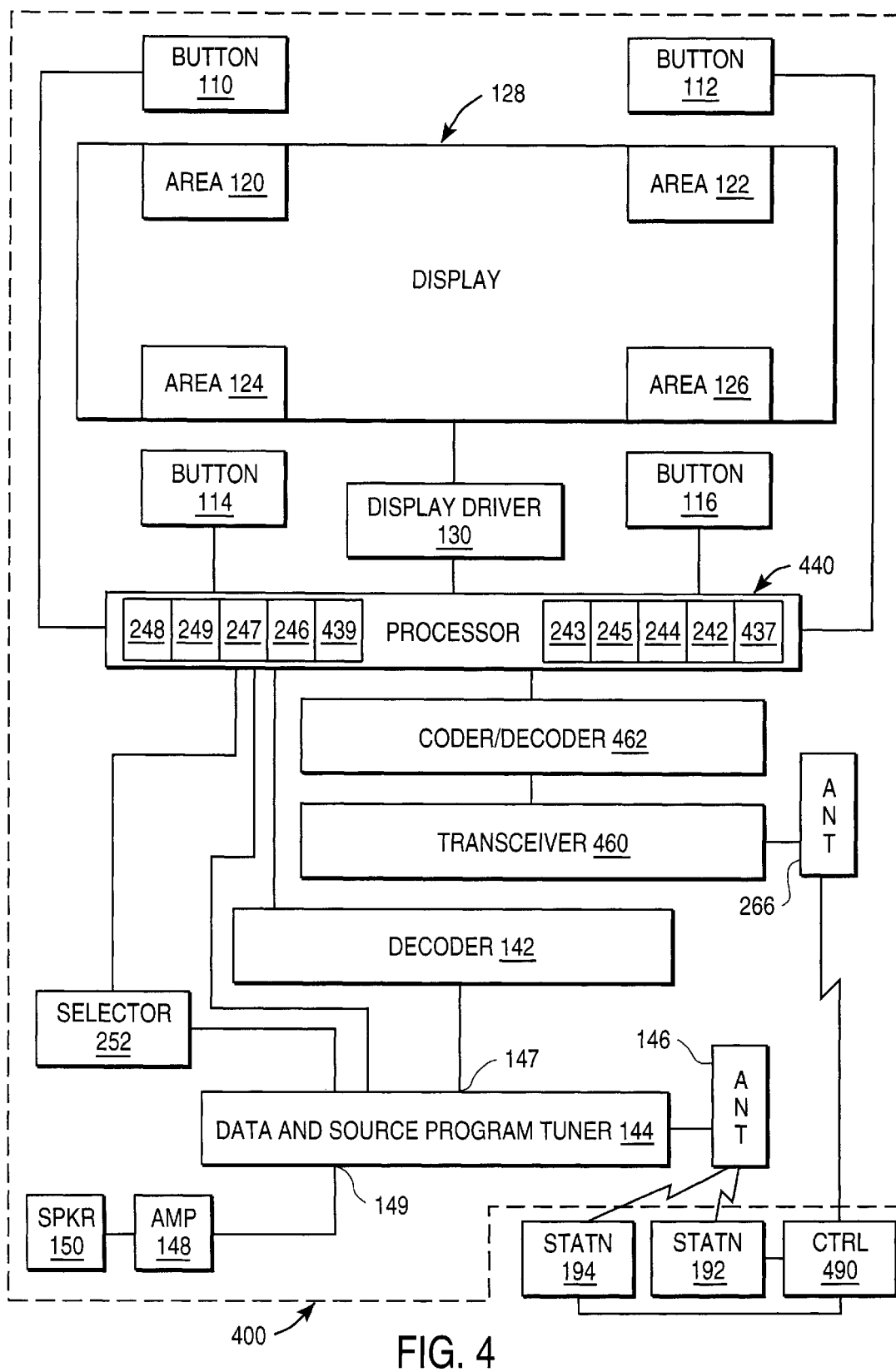
FIG. 4 is a block schematic diagram of a system including a data tuner coupled to a transceiver according to one embodiment of the present invention.

Referring now to FIG. 4, a data tuner coupled to a transceiver which includes the capability to receive a command to transmit a frequency to broadcast the information of interest according to one embodiment of the present invention is shown. The apparatus shown in FIG. 4 is similar to the apparatus of FIG. 2, but is able to send and receive signals to and from the control center 490 either directly or indirectly via one or more relay stations (not shown). Antenna 266 sends and receives signals to and from the control center 490 via transceiver 460 which may be any two-way transceiver such as a two-way pager or cellular telephone, or may be a separate transmitter and receiver. Any apparatus which transmits signals on one or more known frequencies and receives signals on one or more known frequencies can operate as the transceiver 460. Coder/decoder 462, also known as a codec, is coupled to the transceiver 460 to convert signals received from transceiver 460 into digital format and to convert signals, described below, received from processor 440 similar to processor 240 of FIG. 2 into signals which may be broadcast by transceiver 460. In one embodiment, codec 462 is a decoder only, where no coding functions are required to format the output of the processor 440, which in such embodiment (not shown) has an output connected directly to an input of the transceiver 460.

At such time as control center 490 has information of interest to the user of the display 128, in one embodiment, control center 490 broadcasts a message instructing one or more of the apparati 400 to respond with a frequency identifier on which to transmit the information of interest. Antenna 266 receives the transmission and first determines if the message was intended for the receiver 400. Transceiver 460 receives the message and sends it to codec 462 for decoding. Codec 462 decodes the message and passes it to processor 440. Code match 244 compares the code received by codec 462 to the code stored in storage device 242, and if an intended match is discovered, either an exact match between the code stored in code store 242 with the code received by codec 462 or a partial match indicating that the area of interest code received by codec 462 corresponds to one or more areas of interest stored in code store 242, processor 440 determines a frequency which it will send to control center 490 to allow control center 490 to send the information of interest to the user on the specified frequency.

In one embodiment, processor 440 determines the frequency to send to control center 490 by reading the frequency indicated by the selector 252 to identify the frequency to which the data and source program tuner 144 is tuned. An indicator of this frequency and optionally the identification code stored in storage device 242 are encoded by codec 462 and sent via transceiver 460 and antenna 266 to control center 490 to allow control center 490 to instruct the corresponding broadcast station 192, 194 to send the information of interest to the data and source program tuner 144 along with the optional identification code to allow the processor 440 to determine that the information of interest when sent is intended for it. The frequency of the selector may be stored in frequency store 246 and periodically rechecked using timer 247 to indicate the period for rechecking has elapsed and if the frequency indicated by selector 252 does not match that stored earlier, the frequency indicated by selector 252 is sent to control center 490 as described above. Thus, even if the user retunes the data and source program tuner, it will continue to receive information of interest on the new frequency.

In one embodiment, processor 440 determines which frequency to send to control center 490 by scanning the frequencies it can receive to identify one having a signal strength above a predetermined threshold, or having the highest signal strength among a number of active frequencies near the one which the data and source program tuner 144 is tuned. Scanner 443 directs selector 252 to change the tuned frequency of the data and source tuner 144 while signal strength measurer 439 measures and stores the relative signal strength of the tuned frequency. If the newly tuned frequency is higher than the signal strength stored in the measurer 439, the tuned frequency having the higher relative signal strength is stored in frequency store 246. This process is repeated a number of times, or in one embodiment until measurer 439 measures the relative signal strength of all frequencies which data and source program tuner 144 is capable of receiving, and then the frequency scanned having the highest relative signal strength is read from frequency store 246 by processor 440 and sent to codec 462, transceiver 460 and antenna 266 for broadcast to control center 490 as described above.

Figure 5A:
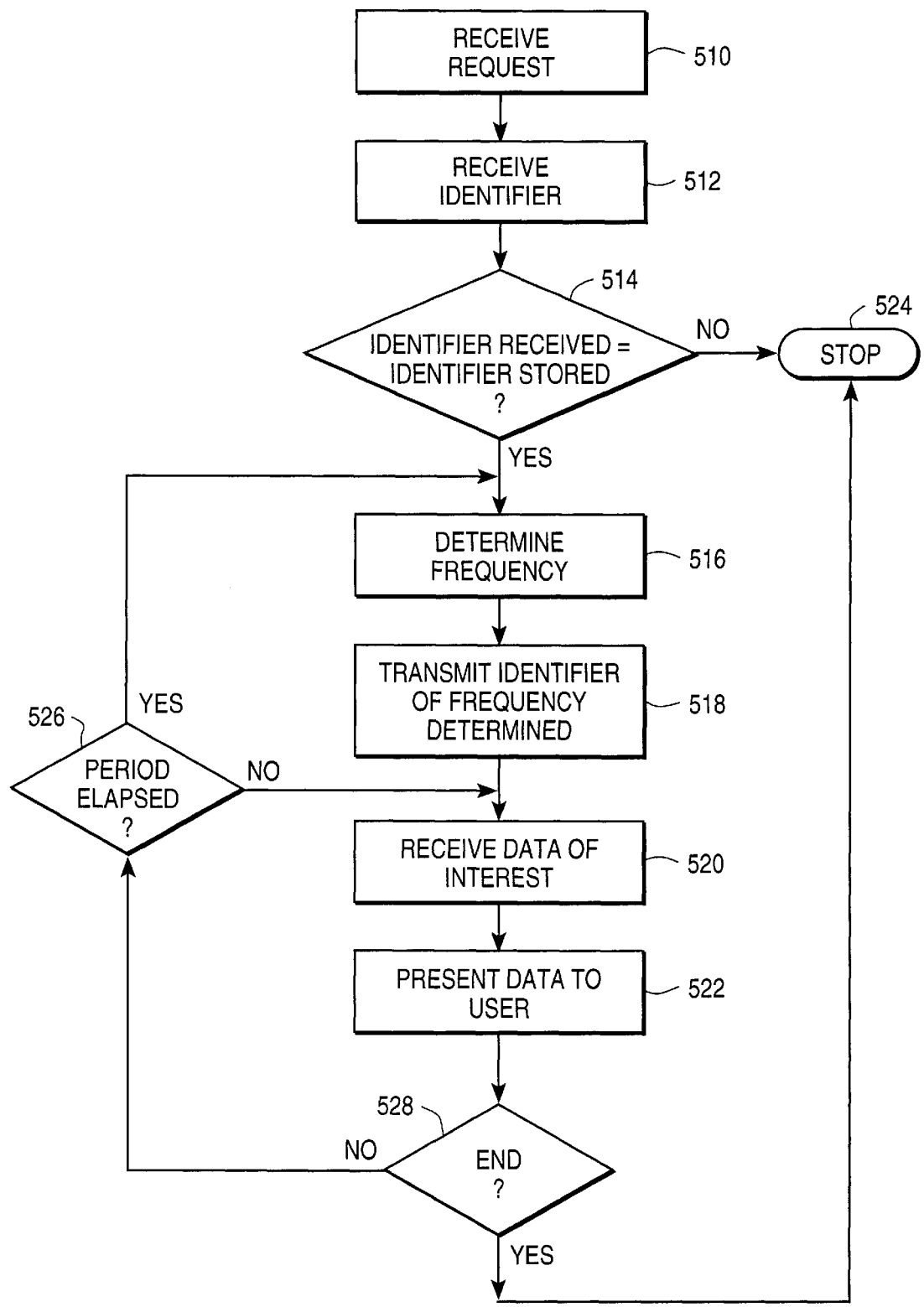
FIG. 5a is a flowchart illustrating a method of tuning a data tuner to receive data of interest according to one embodiment of the present invention.

Referring now to FIG. 5a, a method of tuning a data tuner to receive information of interest according to one embodiment of the present invention is shown. A request is received to transmit an identifier of a frequency on which to transmit information of interest 510. Optionally, a receiver identifier is also received 512 and compared to an identifier stored 514. If the receiver identifier received does not correspond to the identifier stored, the method terminates 524. Otherwise, the frequency to which a tuner is tuned is determined 516 and an identifier of that frequency is transmitted 518. Information of interest is received over the frequency corresponding to the frequency determined and transmitted 520 and some or all of the received data is presented to a user 522, for example by displaying it on a display. Steps 516, 518, 520, 522 may be optionally repeated after a period of time has elapsed 526, or terminated 524 in response to a termination event 528 such as a user indicating a desire to terminate the method.

Figure 5B:
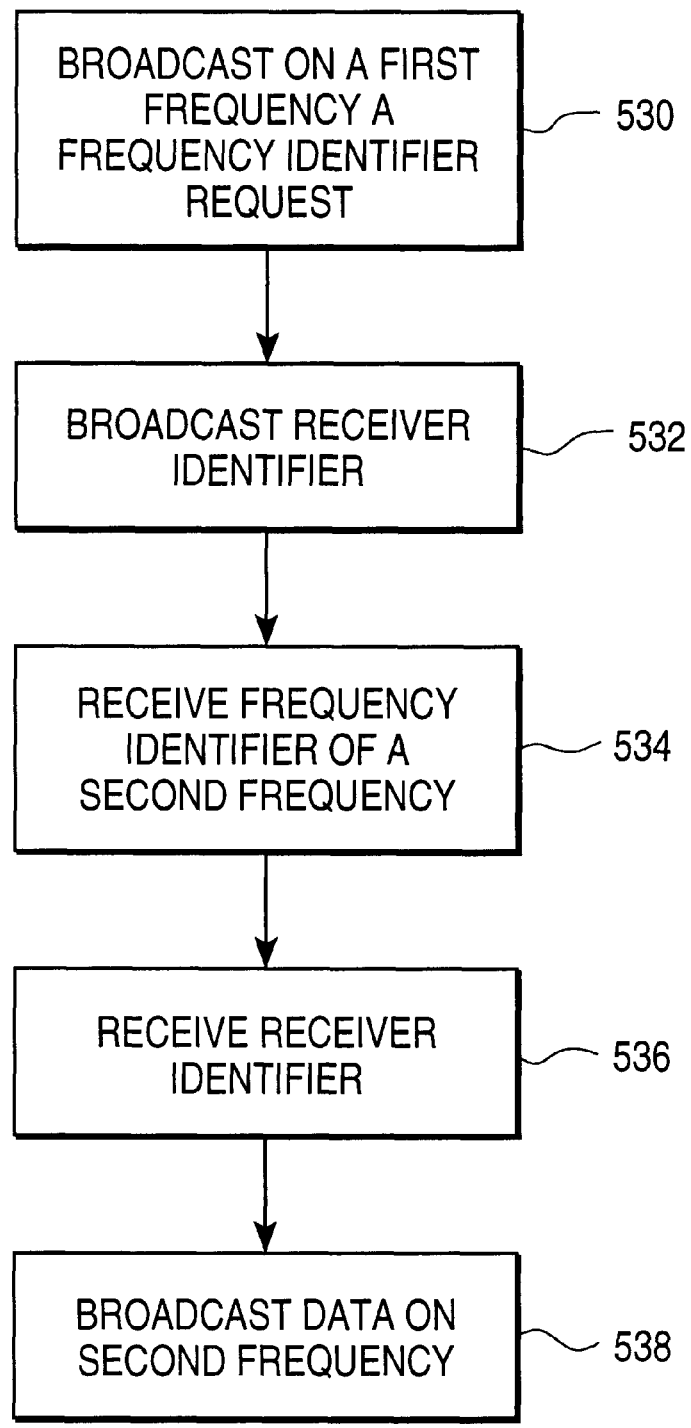
FIG. 5b is a flowchart illustrating a method of determining a proper frequency over which data of interest may be broadcast according to one embodiment of the present invention.

Referring now to FIG. 5b, one embodiment of a method of determining on which frequency to broadcast information of interest is shown. A request for the frequency on which to broadcast the data is broadcast using one frequency 530. An optional receiver identifier is also broadcast on that frequency 532. A frequency identifier is received 534 and optionally, a receiver identifier is also received 536. The information of interest is then broadcast on a frequency corresponding to the frequency identifier received or a broadcaster using the frequency is directed to broadcast the information of interest on that frequency 538.

Figure 5C:
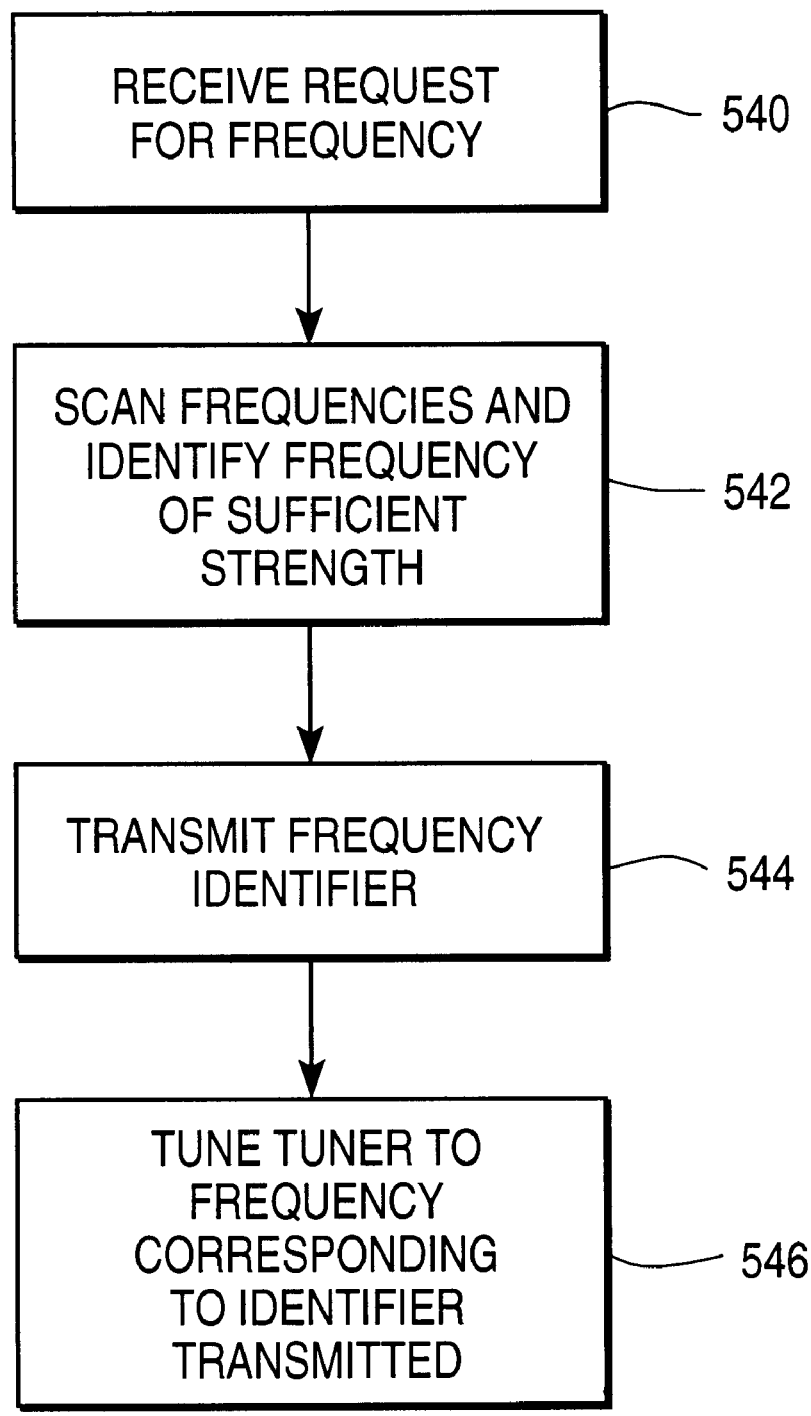
FIG. 5c is a flowchart illustrating a method of tuning a data tuner to receive data of interest according to one embodiment of the present invention.

Referring now to FIG. 5c, a method of tuning a data tuner to receive information of interest according to one embodiment of the present invention is shown. An optional request is received to send a frequency identifier on which the information of interest is to be received 540. It isn't necessary to receive such a request, because the remaining steps in the method of FIG. 5c may be repeated at certain intervals and achieve nearly the same results. Two or more frequencies are scanned to identify a frequency of sufficient strength 542. A frequency of sufficient strength may be the frequency with one of the highest signal strengths of the frequencies scanned, or it may be a frequency with a signal strength above a particular threshold. An identifier of the frequency identified in step 542 is transmitted and the data tuner is tuned to the frequency corresponding to the identifier transmitted 544.

Figure 6:
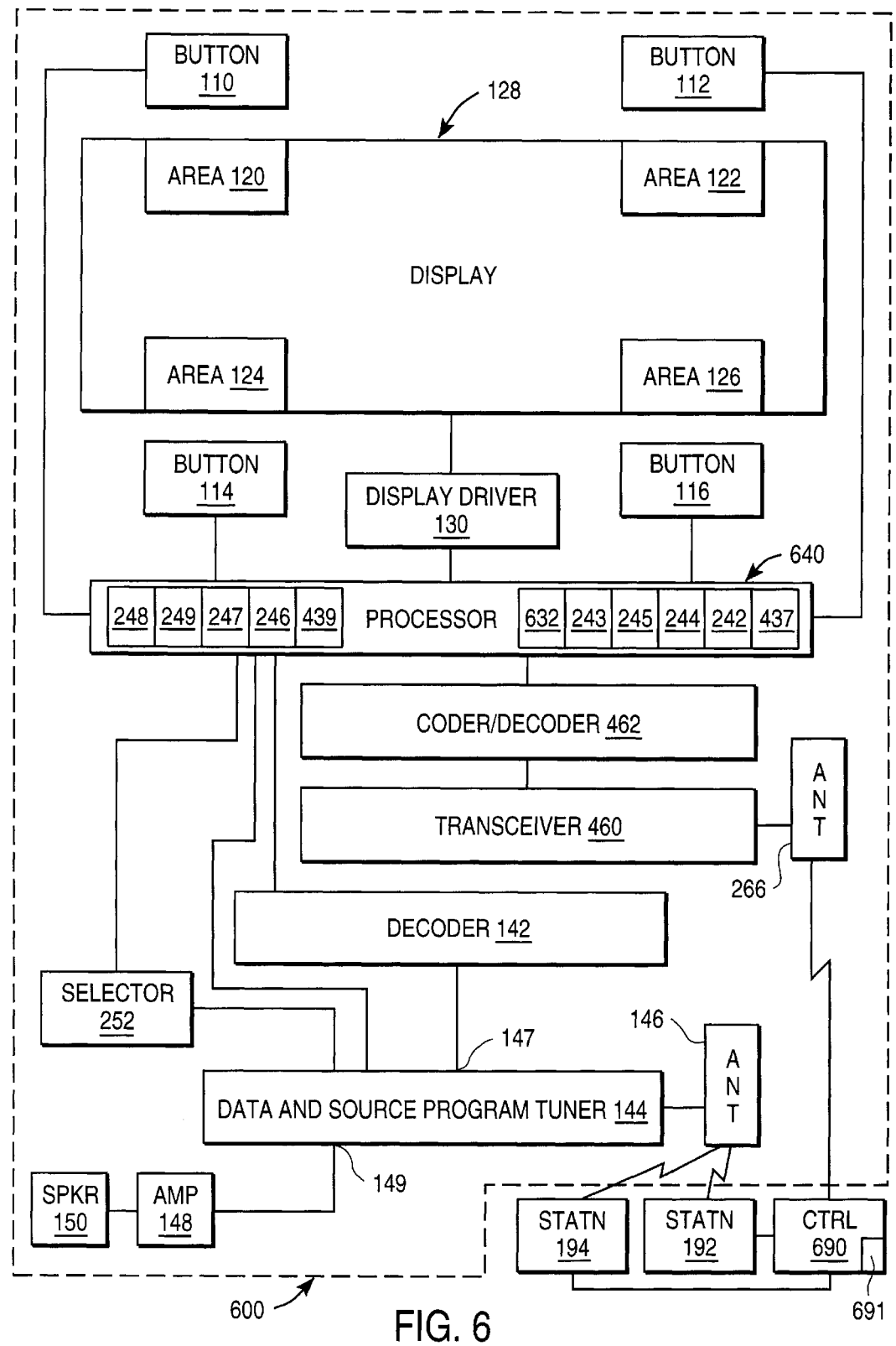
FIG. 6 is a block schematic diagram of a system including a data tuner coupled to a transceiver according to one embodiment of the present invention.

Referring now to FIG. 6, a data tuner coupled to a transceiver according to one embodiment of the present invention is shown. Processor 640 instructs display driver 130 to display on display 128 prompts, such as "What kind of information is desired?" stored in prompt storage 632, such as a flash memory, RAM or ROM. Choices such as "Traffic", "Weather", "Finance" or "Sports" are retrieved from prompt store 632 by processor 640 similar to processor 440 of Figure A, and displayed by display driver 130 in areas 120, 122, 124, 126 respectively. The user may press one or more of the buttons 110, 112, 114, 116 to indicate one or more choices, which may be stored in storage device 249. Processor 640 transmits to control center 690 the response and an optional identifier as described above and stored in storage device 242 or 249 via codec 462 transceiver 460 and antenna 266. Control center 690 identifies the frequency on which broadcast data meeting certain criteria of interest, such as a frequency broadcasting sports information most often, a frequency which will begin its broadcast of sports information soonest or a frequency broadcasting the most sports information in each hour. In one embodiment, control center 690 identifies the proper frequency or frequencies by scanning a conventional computer system containing a database 691 which may contain the amount of time each station broadcasts a particular type of information, the time of day each station broadcasts each type of information, and/or the percentage of time each type of information is broadcast during certain periods, such as each hour, and selecting one or more frequencies according to the users' criteria.

Control center 690 sends one or more identifiers corresponding to the frequencies identified in response to the request described above and an identifier either describing the identifier stored in storage device 242 to identify a particular user, or may broadcast an identifier describing the type of information broadcast by the frequencies identified such as a portion of the identifier stored in storage device 249. In one embodiment, control center 690 sends a code describing the type of information (e.g. 00=traffic, 01=weather, 10=finance, and 11=sports), and the frequencies of: the four stations broadcasting that information most often, the four stations broadcasting that information the soonest and the four stations broadcasting the information the most during the next hour. In one embodiment, control center 690 may broadcast this status information periodically without the need to receive a request for the status information from data receiver and transmitter 600.

In one embodiment, the status information is received by antenna 266, transceiver 460 and codec 462 to allow it to be received by processor 640. Processor 640 may then prompt the user for the type of frequency (i.e. most often, soonest and most in the hour) by sending prompts from prompt store 632 to display 128 via display driver 130 to allow the user tune to one of the frequencies received from the control center 690 as described above, or processor 640 may first scan the frequencies based on the status information and select the strongest signal from among the four transmitted by the control center 690 as described above.

In one embodiment, this status information is periodically broadcast for reception by data and source program tuner 144 on a known frequency, eliminating the need for antenna 266, transceiver 460 and codec 462 but requiring the user to tune the data and source program tuner 144 to the known frequency. In another embodiment, this periodic broadcast of information is made by both stations 192, 194 in the data channel, eliminating the need for the transceiver equipment 266, 460, 462.

In another embodiment, each broadcast station 192, 194 periodically broadcasts status information about itself, such as when the next broadcast of information of each type will occur, how much information of each type it will broadcast during a separate upcoming period such as an hour, and how many times it will update the information during the period. Processor 640 may prompt the user as described above, and then use scanner 243 as described above to identify the stations that broadcast the type of information as desired by the user by storing in frequency store 246 one or more stations that satisfy the user's preferences for type of information and other criteria, and prompting the user for the desired station, if desired, as described above. In one embodiment, scanner 243 only considers a frequency for storing the corresponding identifier in frequency store 246 if the frequency exceeds a threshold signal strength using signal strength measurer 439 as described above. In this embodiment, codec 462, transceiver 460 and antenna 266 are not used, and processor 640 is coupled to the output of the decoder 142 to receive the headers as shown in FIG. 6.

Figures 7A, 7B:
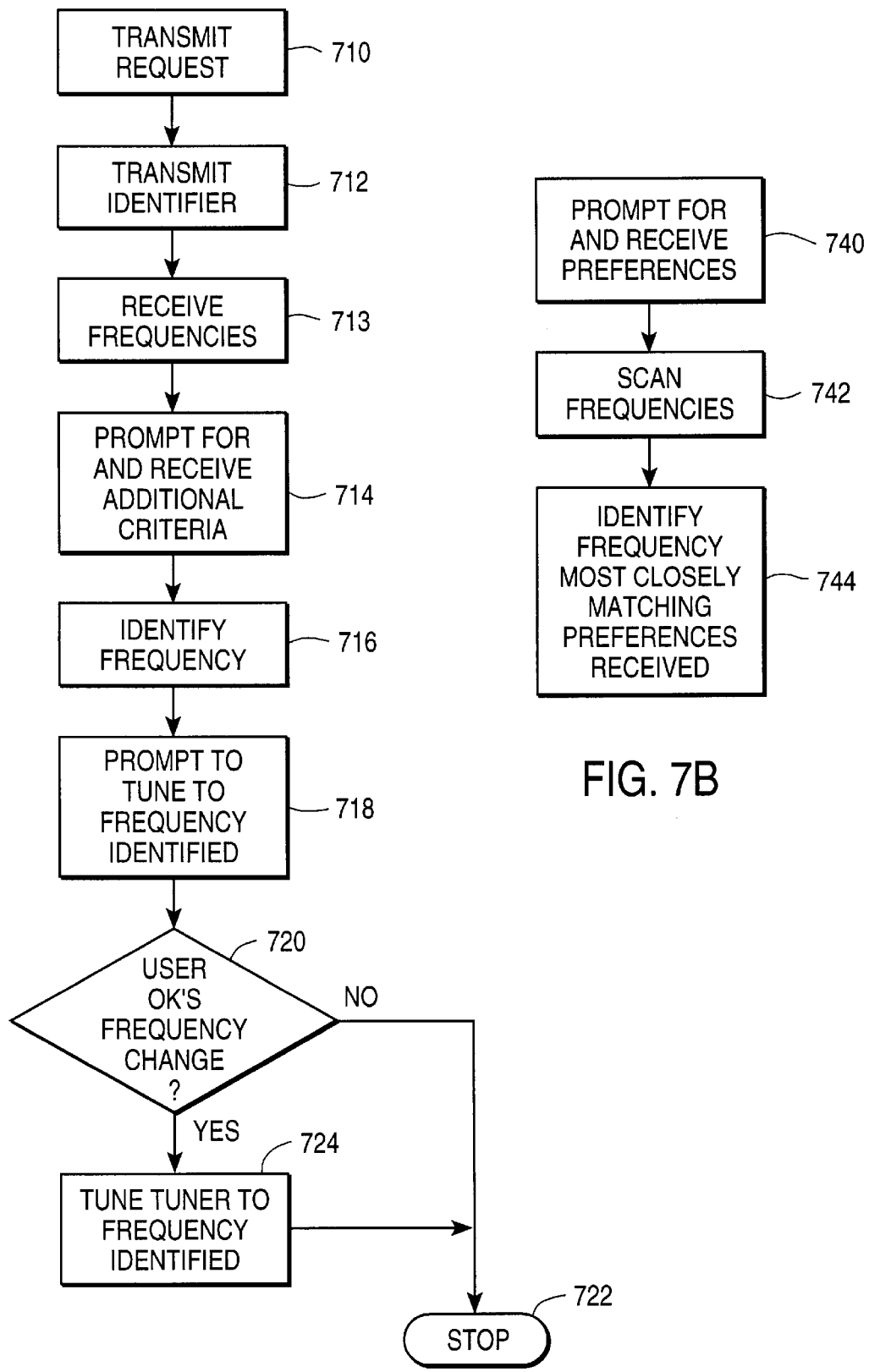
FIG. 7a is a flowchart illustrating a method of tuning a frequency broadcasting a desired type of information in a certain manner according to one embodiment of the present invention.
FIG. 7b is a flowchart illustrating a method of selecting a frequency according to a user's preference according to one embodiment of the present invention.

Referring now to FIG. 7a, a method of tuning a frequency broadcasting a desired type of information in a certain manner according to one embodiment of the present invention is shown. An optional request describing the type of information is transmitted 710, and an optional user identifier may also be transmitted 712. A set of frequency identifiers describing the frequencies broadcasting that type of information is received by a status receiver 713. A user may be prompted for additional criteria 714. In one embodiment, these additional criteria are whether the user wishes to tune to the frequency broadcasting that type of information the most often, the soonest or the most in the hour. A final identification may be automatically made 716. In one embodiment, this identification is made by scanning the frequencies broadcasting the desired type of information and fitting any additional criteria such as the frequency having the strongest reception 716. The user may be prompted to tune to the frequency identified 718 and a second tuner is tuned to that frequency 724 if the user acknowledges the change 720.

Referring now to FIG. 7b, a method of selecting a frequency according to a user's preference according to one embodiment of the present invention is shown. A user is prompted for preferences 740 and the user's input may also be received. In one embodiment preferences include the type of information and other criteria such as the soonest the information of the selected type will be broadcast, the frequency over which the type of information selected is broadcast most often, or the frequency over which the type of information selected is broadcast most in a period, such as an hour. Two or more frequencies are scanned 742 and the frequency most closely matching the users preferences, and any other preferences is identified 744. In one embodiment, one of the other preferences is a frequency received having a signal strength above a threshold level.

Figure 8A:
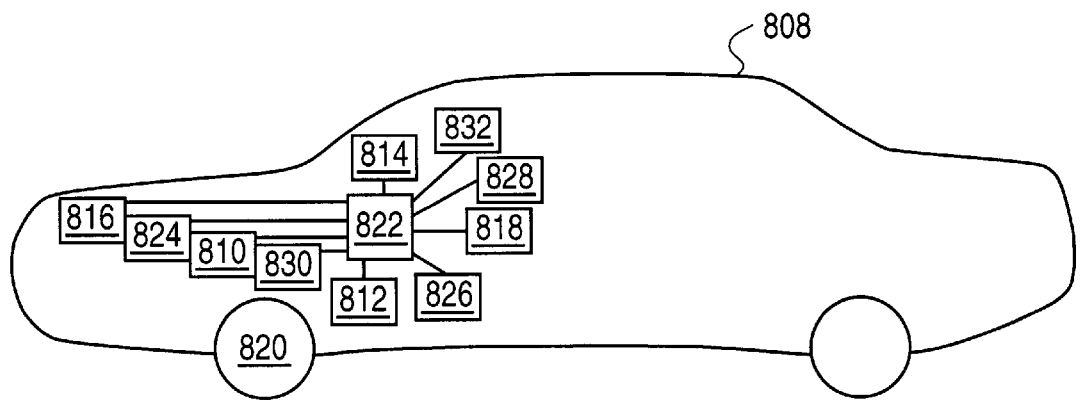
FIG. 8a is a block schematic diagram illustrating an automobile containing a data tuner and transmitter and various data sensors according to one embodiment of the present invention.

The data receivers and methods described above relate to data reception. The transceivers coupled to the data receivers described above may additionally be used for data collection for data such as traffic and weather information to be collated. Where some data receivers contain transmitters, such as the data receivers described above, it is possible to collect traffic and weather information at a relatively low cost. Referring now to FIG. 8a, one embodiment of an automobile 808 with such data collection and transmission capability is shown. Conventional air temperature sensor 816, sensing the temperature of the ambient air in front of the automobile 808, conventional speed sensor 810, coupled to the speedometer to sense the speed of travel of the automobile 808, conventional moisture sensor 812 to sense moisture on the tire 820, conventional global positioning receiver 818 to detect the position of the automobile 808 and conventional windshield wiper switch 814 to detect the speed of the windshield wipers are each coupled to input ports of data receiver/transmitter 822. Conventional engine temperature sensor 824, to sense the temperature of the engine of the automobile 808, conventional brake switch 826, to detect whether the brakes are applied, conventional airbag inflation sensor 828, to detect whether the automobile 808 has been in an accident, tire turn sensor 830 with the ability to detect full corner turns and lane change turns independently based on the amount the wheel is turned, and conventional head lamp switch 832, to detect whether head lamps have been turned on, are also coupled to input ports of data receiver/transmitter 822.

Figure 8B:
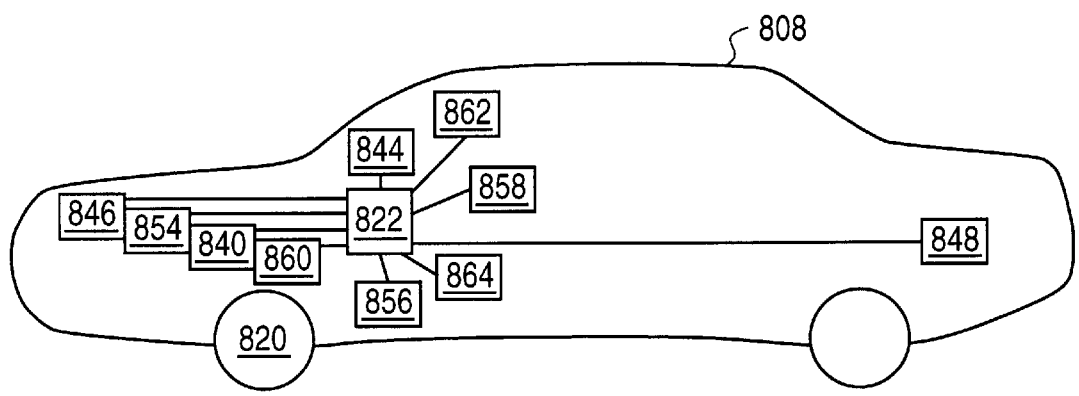
FIG. 8b is a block schematic diagram illustrating the automobile, data tuner and transmitter of FIG. 8a with additional data sensors according to one embodiment of the present invention.

Referring now to FIG. 8b, additional sensors in automobile 808 of FIG. 8a are shown. Conventional accelerator switch 856, to detect when the accelerator of the automobile 808 has been pressed, conventional compass 862, to measure the direction of travel of the automobile 808, conventional wind speed and direction indicator 846, to detect the speed and direction of the wind (which may either be measured when the automobile is stationary, or while the automobile is moving after compensating for the speed and direction of the automobile 808 by using the readings of speed sensor 810 and compass 862, as described below), conventional gas level sensor 848, to measure the level of gasoline remaining in the automobile 808, conventional engine oil level sensor 854, to measure the level of the engine oil, conventional tire pressure sensor 860 to measure the pressure of the tires of the automobile 808 such as tire 820, conventional windshield washer level sensor 840, to measure the level of windshield washer fluid in the automobile 808, conventional electrical sensor 844, to measure the voltage and current of the battery in the automobile 808, and a conventional clock 858 to identify the time of day may also be connected to input ports of data receiver/transmitter 822. Any other sensors to detect road and weather conditions or maintenance status of the automobile 808 may be coupled to an input port of receiver/transmitter 822.

Figure 8C:
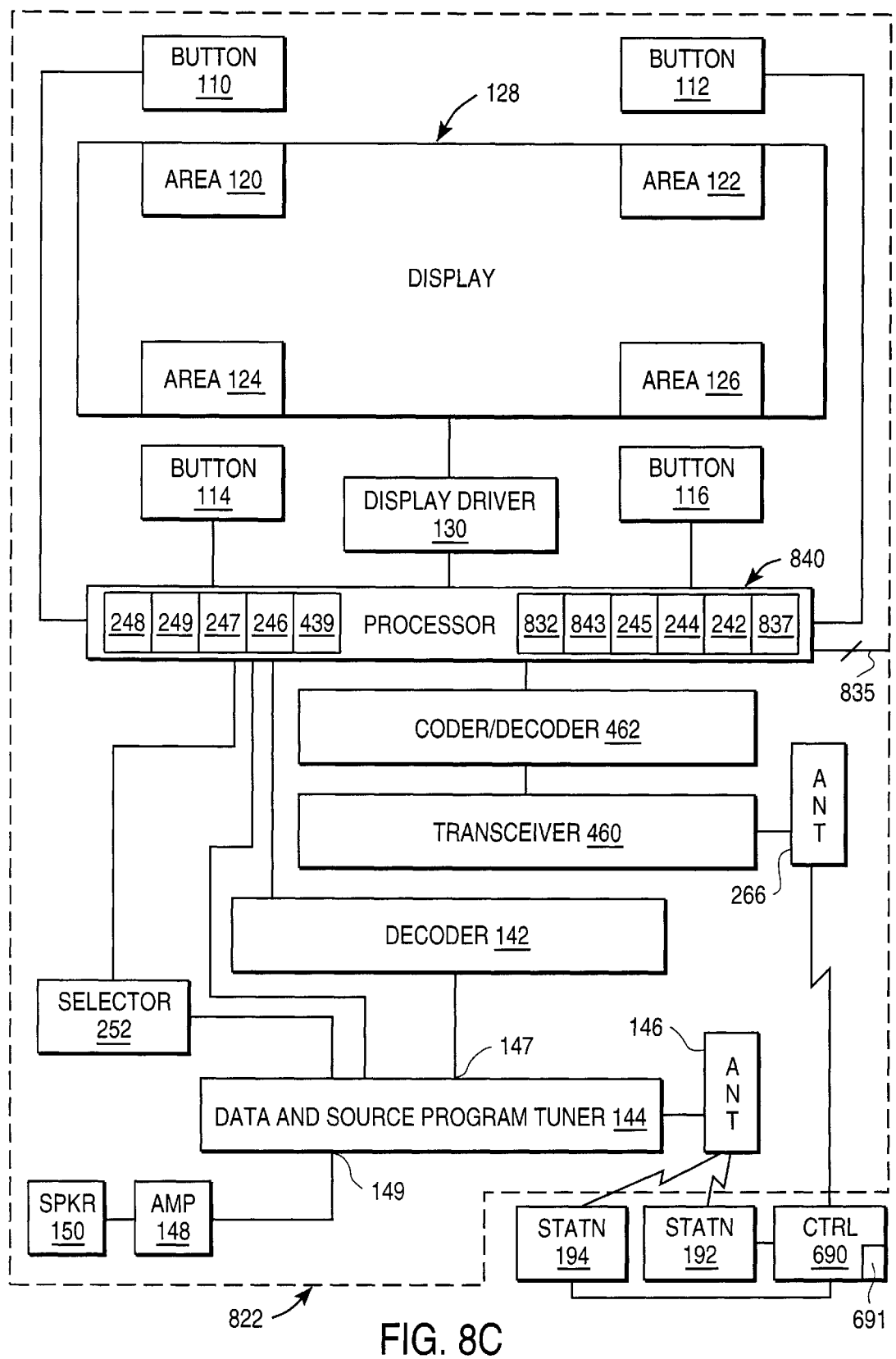
FIG. 8c is a block schematic diagram of a system including a data tuner coupled to a transceiver according to one embodiment of the present invention.

Referring now to FIG. 8c, data receiver/transmitter 822 is more fully shown. In one embodiment, data receiver/transmitter 822 operates similarly to data receiver 600 of FIG. 6 with the modifications described below. Processor 840, similar to processor 640 of FIG. 6, contains I/O interface 837 coupled to I/O ports 835 to allow sensors described above and shown in FIGS. 8a and 8b to be read and processed by processor 840 as set forth below. Processor may access an addressable data memory 843 such as a conventional disk, ROM, RAM or flash memory which may be internal or external to the processor 840 to store the data received by I/O ports 835. Data memory 843 may be used by processor 840 in a circular buffer arrangement where the oldest data is periodically overwritten with new data by processor 840.

Processor 840 may receive and periodically store data received on the I/O inputs 835 in response from a signal from timer 247. Some data may be stored as received on the I/O inputs 835 and other data may be stored after calculation or filtering as described above with reference to the wind speed sensor 846 of FIG. 6. In one embodiment, data is stored in data memory 843 with a time of day header to allow a later determination of the time of day the data was stored as described below. Processor 840 may retrieve some or all of the data stored in data memory 843 upon a command from control 690 broadcast in the data channel via stations 192, 194, or in response to an identified situation such as the airbag inflation sensor 828 indicating the airbag has inflated. The command is received and decoded by antenna 146, data and source program tuner 144 and decoder 142. Processor then may interpret the command by sending requested data to codec 462, transceiver 460 and antenna 266 for receipt by control center 690. The data sent may include instantaneously read data from I/O interface 837, the data stored in data memory 843, the ID code stored in storage device 242, user responses from buttons 110, 112, 114, 116, the currently tuned frequency of selector 252 or any combination of these or other available data. Control center 690 may then process the data received and fashion additional messages to be broadcast by stations 192, 194.

Transceiver 460 and codec 462 may be used as described above to transmit the data in one embodiment. In another embodiment, transceiver 460 may be replaced with a transmitter, and codec 462 may be replaced with a coder where these devices are used for transmission but not reception.

An example of an application of numbers of transmitters 822 deployed in many vehicles is as follows: Referring now to FIGS. 8a through 8c, airbag inflation sensor 828 detects that an airbag has deployed. Processor 840 transmits a message that the airbag has been deployed and includes the position of the vehicle 808 from global positioning receiver 818 via codec 462, transceiver 460 and antenna 266 to control center 690. Control center 690 matches the position of the vehicle to the town in which the vehicle 808 has deployed its airbag, and utilizing a database/computer system 691 containing the ID codes stored in the storage device 242 of the receivers 822 of the volunteer rescue department in that town, broadcasts an alert message and the location of the disabled vehicle 802 to the data receivers 822 of the volunteer rescue department via stations 192 and 194 with the ID codes to allow the message to be displayed only on the displays 128 of the receivers of the volunteer rescue department. Because only these receivers get word of the accident, thrill seekers and vandals do not have notice of the accident, preventing them from rushing to the scene. Meanwhile, control center 690 broadcasts a message instructing receivers 822 in still other vehicles in the area that are traveling in the direction of the accident to take an alternate route. Receivers 822 in those other vehicles receive the location of the accident via antenna 146, tuner 144 and decoder 142 and may then use the data regarding location and direction from their own global positioning receiver 818 and compass 862 to identify if they should display on their own displays 128 the text of the warning message, "accident ahead in this direction—use alternate route." Periodically, the control center will broadcast via stations 192, 194 a request for information from receivers 822 in automobiles 808 in the vicinity of the position of the accident requesting them to transmit their positions if their speed drops, for instance, below twenty miles per hour for more than forty five seconds (to identify vehicles caught in the resulting traffic backup while eliminating automobiles 808 stopped at traffic lights). Each receiver 822 receives the message via antenna 146, tuner 144 and decoder 142 and determines its position and direction of travel to identify if it is headed toward the position received in the message and monitors its current speed from speed sensor 810. If the speed monitored is below the twenty mile per hour threshold, processor 840 retrieves data from data memory 843 and compares the time of day header stored to locate all records up to the first one more than forty five seconds prior, and reads the speed stored in data memory 843 at those times. If the speed is determined to be below the threshold of twenty miles per hour for the entire duration of the forty five seconds, processor 840 transmits a response including its position from global positioning receiver 818 to control 690 via codec 462, transceiver 460 and antenna 266. Control center 690 may collate the responses it receives to identify the length and amount of time it takes to make it through the traffic backup, and transmit the information to receivers 822 in automobiles 808 in an even greater radius than those in the backup to allow them to select an alternate route, or choose to head through the backup. The information determined above may also be read by announcers at stations 192, 194 for audio transmission to the user of the transmitter 822 via antenna 146 data and source program tuner 144, amplifier 148 and speaker 150. The request for information regarding speed below twenty miles per hour for more than forty five seconds may be again sent by the control center 690 for the same area at a later time, with the response procedure described above repeated by other cars 808 which have moved into the area. Control center 690 can determine if the back-up is becoming better or worse based upon a comparison of the later responses with the earlier responses stored in the database/conventional computer system 691 of the control center. If control center determines that the back-up is subsiding, the message warning drivers of the backup may be sent with instructions to display the warning only on receiver/transmitters 822 in automobiles within a smaller radius of the accident site than previous warnings.

In one embodiment, the original message may include a time of day formula which allows the processor 840 in each receiver/transmitter 822 to determine an exact time to send any data requested. In an alternate embodiment, the receiver/transmitter may send the data at a predetermined interval from the time the original message was received, or send the data at a random time. In another embodiment, receiver transmitters may send the requested data at the same time, just as many cellular telephone users may place calls simultaneously.

Warning messages may be text-based or graphical in two colors or many colors. For example, receiver/transmitter 822 may interpret messages sent by control center 690 via stations 192, 194 warning of slow traffic by displaying a symbol of a traffic light with the middle position illuminated in yellow, stopped traffic using the top position illuminated in red, or traffic flowing at or near the limit using the lower position illuminated in green.

Other information may be provided to users of receiver/transmitters such as the road conditions one, three or five miles ahead. In one embodiment, receiver/transmitter 822 prompts the user for information on the display 128, and the user communicates using buttons 110, 112, 114, 116 as described above. Receiver transmitter may then transmit to control center 690 a request for this information along with its ID code in storage device 244 and the frequency to transmit the response as described above, and control center 690 may compute the response from traffic information stored in computer/database 691. Alternatively, the control center 690 may periodically broadcast to data and source program tuner 144 sufficient data outlining traffic conditions in all areas to allow processor 840 to compute the response, which may then be displayed on display 128.

In one embodiment, a switch 864 may, allow the operator of receiver/transmitter 822 to disable the sending of environmental data by receiver transmitter 822 to the control center 690. In one embodiment, control center 690 may send a message to receiver transmitter polling the status of this switch 864 or overriding it to re-enable the sending of the data.

It is noted that traffic and weather status information may be collected by many receiver transmitters 822 in automobiles 808, and may be broadcast not only to receiver transmitters 808 but other systems containing data tuners 144 which are not receiver transmitters 822 or systems which contain data receivers and transmitters without sensors, such as those described above. Information provided to such systems may be plotted on graphs or maps.

Figure 8D:
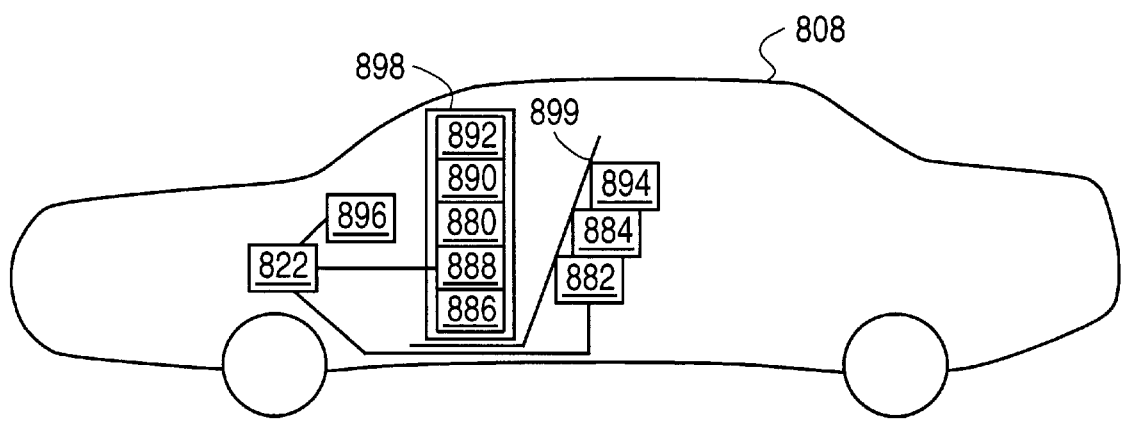
FIG. 8d is a block schematic diagram illustrating the automobile, data tuner and transmitter of FIG. 8a with additional data sensors and environmental actuators according to one embodiment of the present invention.

Other types of environmental information may be sensed. Referring now to FIG. 8d, additional environmental sensors coupled to a receiver transmitter are shown. In one embodiment, sensors sensing human conditions such as a conventional blood pressure sensor 880, conventional human temperature sensor 882, conventional heart rate monitor 884, conventional electricity resistance sensor 886, conventional finger print sensor 888, conventional blood type sensor 890 and conventional DNA sensor 892 may be coupled to an input port of receiver/transmitter 822. Receiver transmitter may be installed in an automobile as shown in FIGS. 8a and 8b, or may be carried by the person monitored by the sensors 880, 882, 884, 886, 888, 890, 892. These sensors may operate in the same manner as described with reference to FIGS. 8a and 8b. Some sensors may trigger an instant transmission by receiver/transmitter 822, while the output of others are stored as above for transmission at a later time or along with those transmitted instantly.

The receiver transmitter 822 may also be coupled to actuators 894, 896 which attempt to modify the environment. A device 894 which shocks the heart into beating such as a conventional defibrillator, a horn actuator 896 or other actuators may be activated remotely from the control center 690. For example, when heart rate monitor 884 detects a heart rate out of an expected range, receiver/transmitter may instantly send the control center 690 a message including a signal that the heart rate monitor is too high or too low the ID code of the receiver monitor and a location of the individual using the global position sensor. Control center 690 may then transmit a signal to receiver/transmitter 822 via data and source program tuner 144 instructing processor 840 to activate the heart shocking device 894 and horn actuator 896 to allow rescuers, who may be summoned as described above, to locate the victim more easily.

In one embodiment, sensors 892, 890, 880, 888, and 886 are coupled to the steering wheel 898 and sensors 884, 882 and actuator 894 are coupled to the seat 899 of automobile 808 so as to come into contact with the driver. In another embodiment, sensors 892, 890, 880, 888, and 886 and actuator 894 are connected directly to the clothing or the person being sensed and actuated.

Figure 9A:
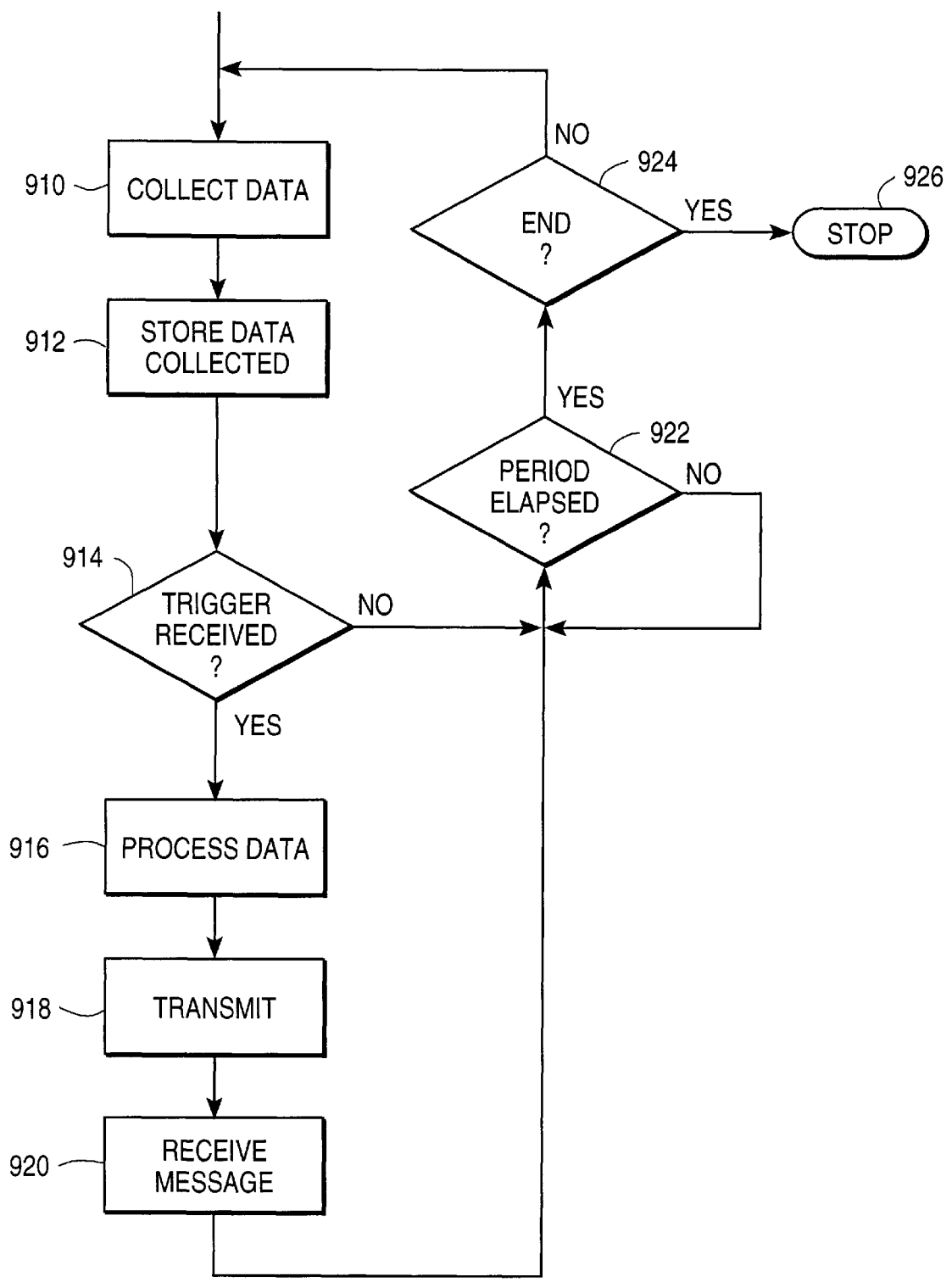
FIG. 9a is a flowchart illustrating a method of collecting and transmitting data according to one embodiment of the present invention.

Referring now to FIG. 9a a method of collecting and transmitting data according to one embodiment of the present invention is shown. Data is collected 910 and optionally stored 912. In one embodiment, the data is stored in a circular fashion with the oldest data overwritten by new data. A data trigger is received 914 and some or all of the data collected and/or stored is transmitted 918. In one embodiment, the data trigger is a broadcast message received on a frequency, and may include the fulfillment of conditions in the broadcast message. In another embodiment, the trigger is a timer. In another embodiment, the trigger is a piece of data having a specified value, such as that indicating that an airbag has been deployed. In one embodiment, the transmission step 918 is performed using a different frequency than the frequency over which the broadcast is received in step 914. In another embodiment, step 914 is not performed, and step 916 unconditionally follows step 912. In one embodiment, transmission step 918 is preceded by a processing step 916 in which the data collected and/or stored is processed according to the message received and the results are transmitted instead of or in addition to data collected or stored. The data collection and storage of steps 910 and 912 may be repeated after a certain period has elapsed 922. In one embodiment, if the method may terminate 926 in response to an event 924 such as a user indicating a desire to terminate the method. In one embodiment, additional messages related to the transmission performed in step 914 are received 920, for example to display information related to the information transmitted.

Figure 9B:
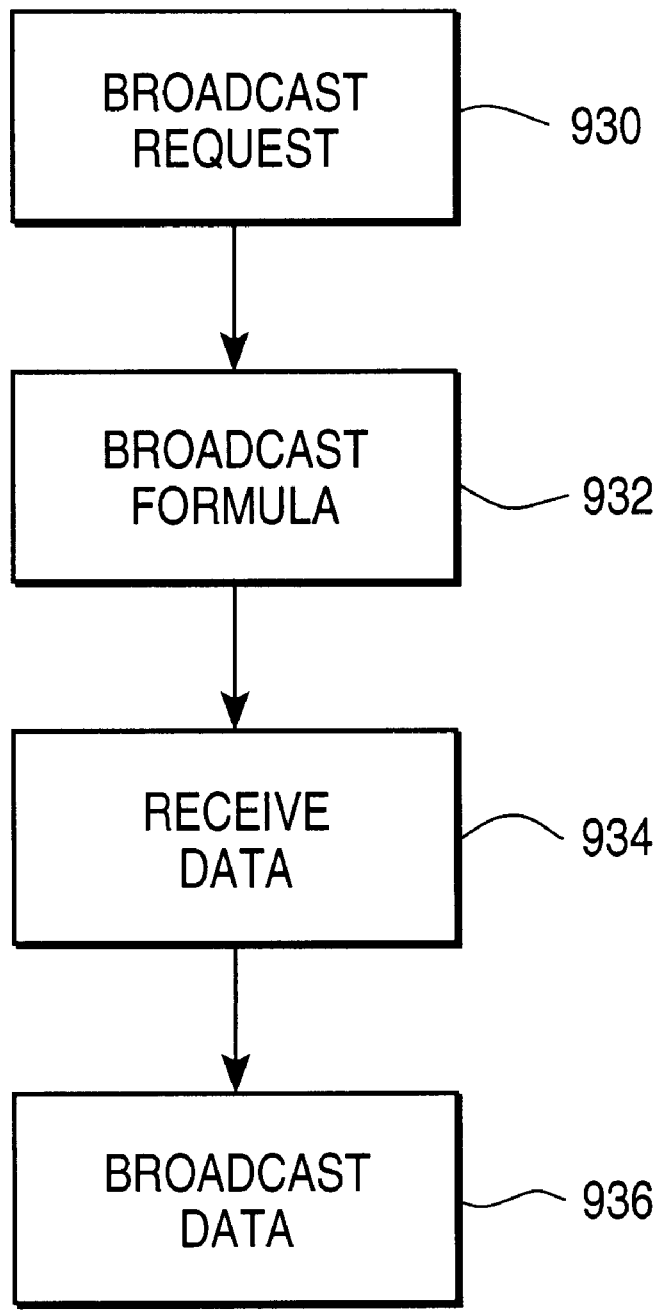
FIG. 9b is a flowchart illustrating a method of communicating environmental data according to one embodiment of the present invention.

Referring now to FIG. 9b, one embodiment of a method of communicating environmental data is shown. A request for environmental data is broadcast over a first frequency

930. An optional formula which will enable the receiver to compute a time of day for sending the response may also be broadcast 932. Environmental data and other data is received over a second frequency 934. The data may then be broadcast 936 using the first frequency, or other frequencies.

What is claimed is:

1. A system for transmitting environmental conditions to a control center over a first frequency comprising:

a data tuner for receiving a request for information from the control center over a second frequency, having an output for sending the request;

a plurality of sensors for sensing environmental conditions, each sensor having an output to provide data regarding the environmental conditions;

a processor having at least one first input coupled to the sensor outputs for receiving the data output by the sensors, a second input coupled to the data tuner output, and an output for sending at least a portion of data corresponding to the data from the first inputs responsive to the request, the processor determining one of a group including a particular time and manner for sending the portion of data corresponding to the data from the first inputs responsive to the request, the processor determining one of a group including a particular time and manner based upon a formula included in the request for information from the control center; and a transmitter having an input coupled to receive the data output by the processor output, and an output for transmitting the data at the transmitter input over the first frequency, the transmitter transmitting the data at the transmitter input in the particular time and manner determined by the processor.

* * * * *